United States Patent [19]

Turkal

[11] Patent Number: 4,958,309

[45] Date of Patent: Sep. 18, 1990

[54] APPARATUS AND METHOD FOR CHANGING FREQUENCIES

[75] Inventor: Randy J. Turkal, Warnock, Ohio

[73] Assignee: NRC Corporation, Dayton, Ohio

[21] Appl. No.: 304,050

[22] Filed: Jan. 30, 1989

[51] Int. Cl.⁵ .............................................. G05B 19/02
[52] U.S. Cl. .................................... 364/580; 364/570; 328/72
[58] Field of Search ...................... 364/580, 579, 270.3, 364/270, 550, 570, 480; 307/569, 480; 371/15.1, 16.1; 331/49, 162, 158; 323/55, 72, 154

[56] References Cited

U.S. PATENT DOCUMENTS

| | | | |
|---|---|---|---|
| 3,868,647 | 2/1975 | Zandveld | 340/172.5 |
| 3,980,993 | 9/1976 | Bredart et al. | 340/172.5 |
| 4,050,096 | 9/1977 | Bennett et al. | 364/200 |
| 4,095,267 | 6/1978 | Mortmoto | 364/200 |
| 4,191,998 | 3/1980 | Carmody | 364/200 |
| 4,217,637 | 8/1980 | Faulkner et al. | 364/200 |
| 4,254,475 | 3/1981 | Cooney et al. | 364/900 |
| 4,398,155 | 8/1983 | Atwell, Jr. et al. | 328/154 |
| 4,458,308 | 7/1984 | Holtey et al. | 364/200 |
| 4,499,536 | 2/1985 | Gemma et al. | 364/200 |
| 4,509,120 | 4/1985 | Daudelin | 364/200 |
| 4,748,417 | 5/1988 | Spengler | 307/480 |
| 4,813,005 | 3/1989 | Redig et al. | 364/580 |
| 4,837,764 | 6/1989 | Russello | 371/15.1 |
| 4,855,616 | 8/1989 | Wang et al. | 328/72 |

Primary Examiner—Parshotam S. Lall
Assistant Examiner—Michael Zanelli
Attorney, Agent, or Firm—Wilbert Hawk, Jr.; Albert L. Sessler, Jr.

[57] ABSTRACT

A microprocessor controlled circuit and associated firmware program provide a capability to change output frequencies when required. A plurality of frequency generating devices are included, and logic circuitry is used to determine which frequency generator is coupled to the microprocessor to provide the desired output frequency. The logic circuitry is controlled by the microprocessor in accordance with a comparison of a data pattern stored in the internal random access memory of the microprocessor with at least one of a plurality of data patterns stored in a read only memory, which data patterns represent the frequency generating devices.

14 Claims, 5 Drawing Sheets

APPARATUS AND METHOD FOR CHANGING FREQUENCIES

BACKGROUND OF THE INVENTION

In various devices which include microprocessor controlled circuits, different timing clock frequencies are needed for different applications. In such devices, the correct clock must be connected to the microprocessor with jumpers before initial power-up of the circuit. If at a later time the clock frequency needs to be changed, the circuit must be powered down and the jumpers must be changed to connect the microprocessor to a clock having the desired new frequency. Such a procedure is awkward and time consuming, and requires that operation of the circuit be terminated during the change-over. It would be clearly advantageous if the change in frequencies could be accomplished automatically and without the need to terminate operation of the circuit.

SUMMARY OF THE INVENTION

This invention relates to an apparatus and method for changing frequencies and more particularly relates to an apparatus and method in which a change in frequencies is accomplished under software control and without the need for interrupting circuit operation.

In accordance with one embodiment of the invention, frequency control apparatus for providing a selected one of two frequencies to a microprocessor comprises, in combination, first frequency generating means capable of generating a signal having a first frequency; second frequency generating means capable of generating a signal having a second frequency; a microprocessor to which signals of said first frequency or said second frequency are selectively applied; logic circuit means for selectively gating a signal from either said first frequency generating means or said second frequency generating means to said microprocessor; flip-flop means for controlling said logic circuit means and having a first input coupled to an output of said microprocessor; address decoder means controlled by said microprocessor and coupled to a second input of said flip-flop means; memory means coupled to said microprocessor for control thereof; and reset means controlled by said address decoder means and coupled to said microprocessor for resetting said microprocessor.

In accordance with a second embodiment of the invention, a process for providing a selected one of two different frequencies from two frequency generating means through logic means to a microprocessor having memory means comprises the following steps: (a) determining whether a data pattern in the microprocessor memory is identical to a first reference pattern associated with a first of two frequencies; (b) if said patterns are identical, controlling said logic means to cause a first of the two frequencies to be provided to the microprocessor from a first frequency generating means; (c) if said patterns are not identical, determining whether the data pattern in the microprocessor memory is identical to a second reference pattern associated with a second of the two frequencies; (d) if said data pattern and said second reference pattern are identical, controlling said logic means to cause a second of the two frequencies to be provided to the microprocessor from a second frequency generating means; (e) if said data pattern and said second reference pattern are not identical, determining which of the two frequencies is required; (f) writing a reference pattern associated with the selected one of the two frequencies into the microprocessor memory means; (g) resetting the microprocessor; (h) making a further determination as to whether the data pattern which has been written into the microprocessor memory is identical to said first reference pattern; and (i) repeating conditional steps (b), (c) and (d) to cause the desired frequency to be provided to the microprocessor until the desired frequency is changed.

It is accordingly an object of the present invention to provide a novel apparatus for changing frequencies.

Another object is to provide a novel method for changing frequencies.

Another object is to provide a novel microprocessor controlled automatic frequency change circuit.

With these and other objects, which will become apparent from the following description, in view, the invention includes certain novel features of construction and combinations of parts, a preferred form or embodiment of which is hereinafter described with reference to the drawings which accompany and form a part of this specification.

DETAILED DESCRIPTION OF THE INVENTION

Figure 1:
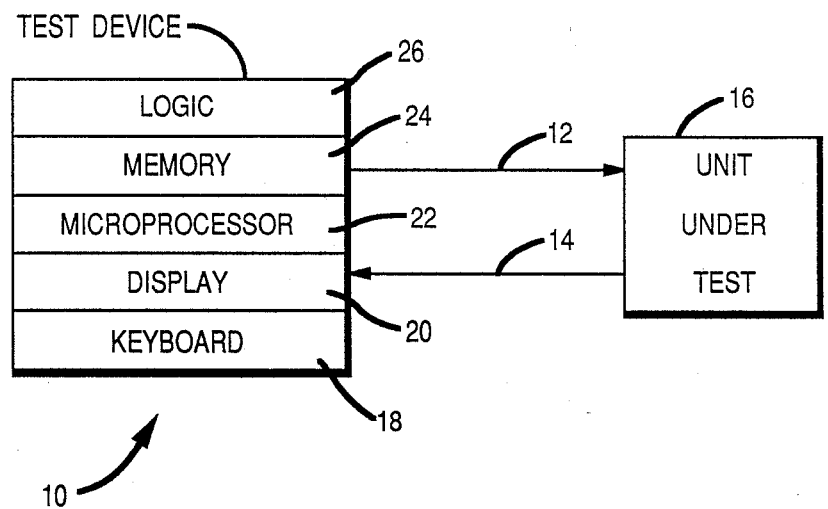
FIG. 1 is a block diagram showing the present invention embodied in a test device which is coupled to a unit under test.

Referring now to FIG. 1, the apparatus and method for changing frequencies of the present invention are capable of being used in a number of different applications. One such application is in a testing device which may be used in testing various elements of a data processing system. It is common for the owner of such a system to select various elements of the system from different manufacturers in order to achieve the precise combination desired. Thus, for example, a first type of business terminal employed in such a system might be purchased from one manufacturer, while a second type of business terminal might be purchased from a second manufacturer. It is entirely possible that these two terminals would operate on different basic frequencies.

When such a system is assembled, it may be necessary to test each individual element of the system in the event of improper operation. It is, of course, desirable that this testing can be accomplished by a single testing device, in order to avoid the inconvenience and expense of having to employ a number of different testing devices. Since various elements of the system may require the application of different frequencies for the necessary testing, it is advantageous if the test device can provide the necessary plurality of frequencies.

In FIG. 1, a test device 10 is coupled by paths 12 and 14 to a unit under test 16. The test device 10 may include a keyboard 18, a display 20, a microprocessor 22, a memory 24 and appropriate logic circuitry 26.

Figure 2:
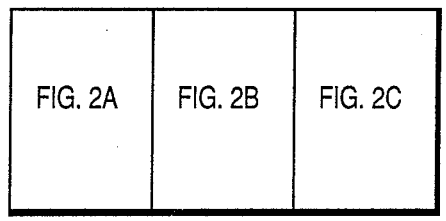
FIG. 2 is a diagram illustrating the manner in which the circuit diagrams of FIGS. 2A, 2B and 2C are combined.
Figure 2A:
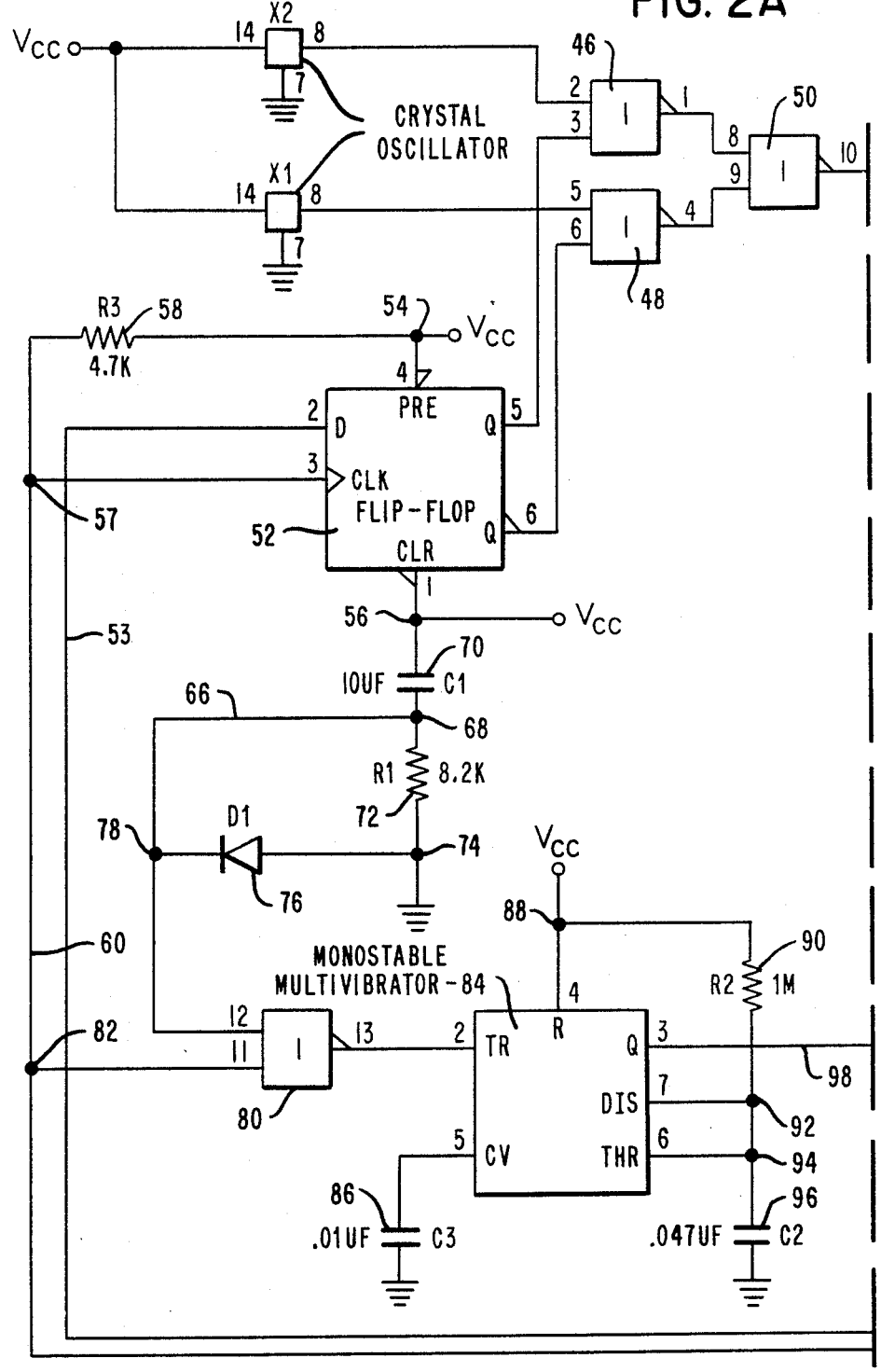
FIGS. 2A, 2B and 2C, taken together, constitute a diagram of the microprocessor controlled automatic frequency change circuit of the present invention.
Figure 2B:
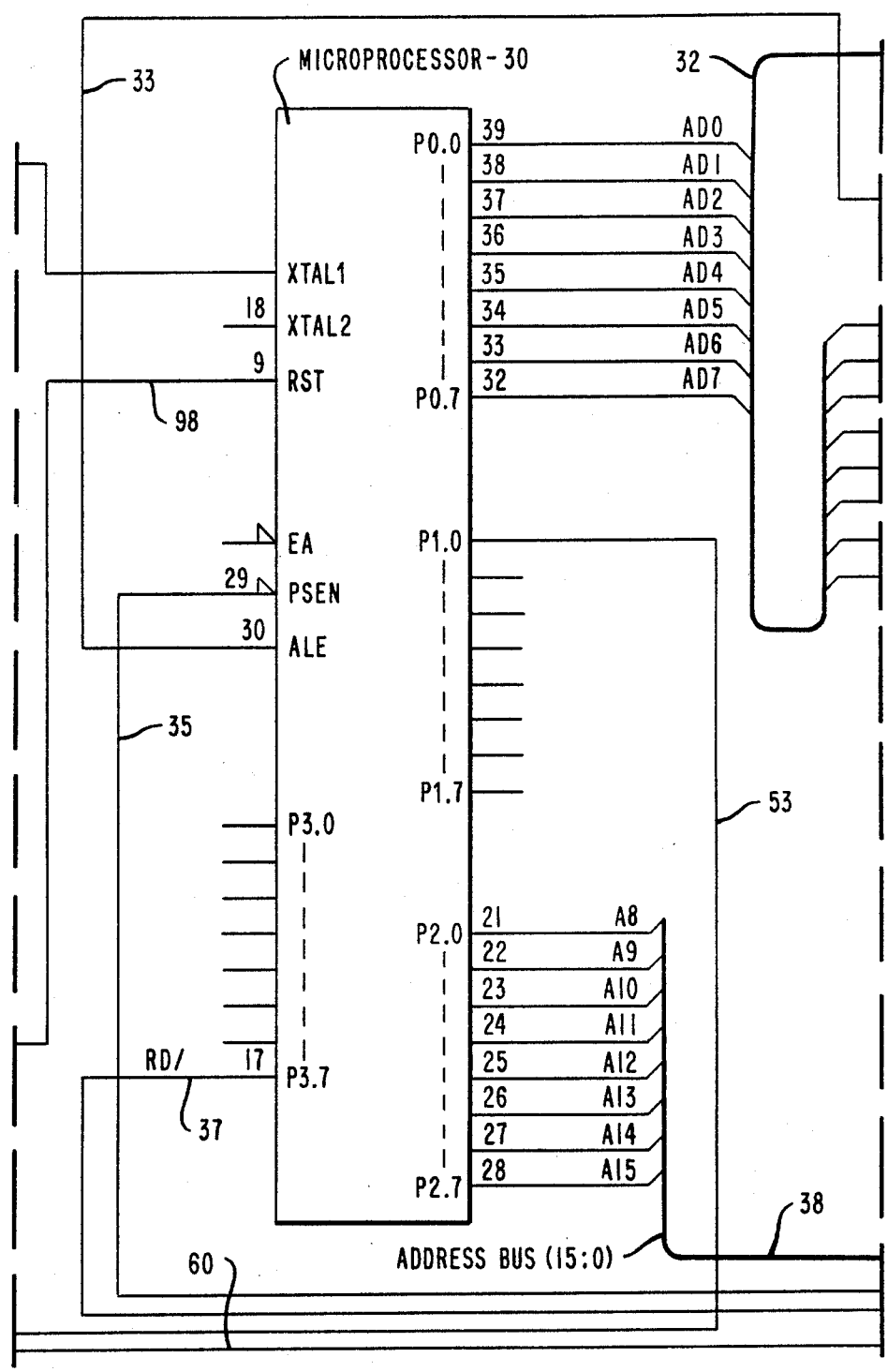
Figure 2C:
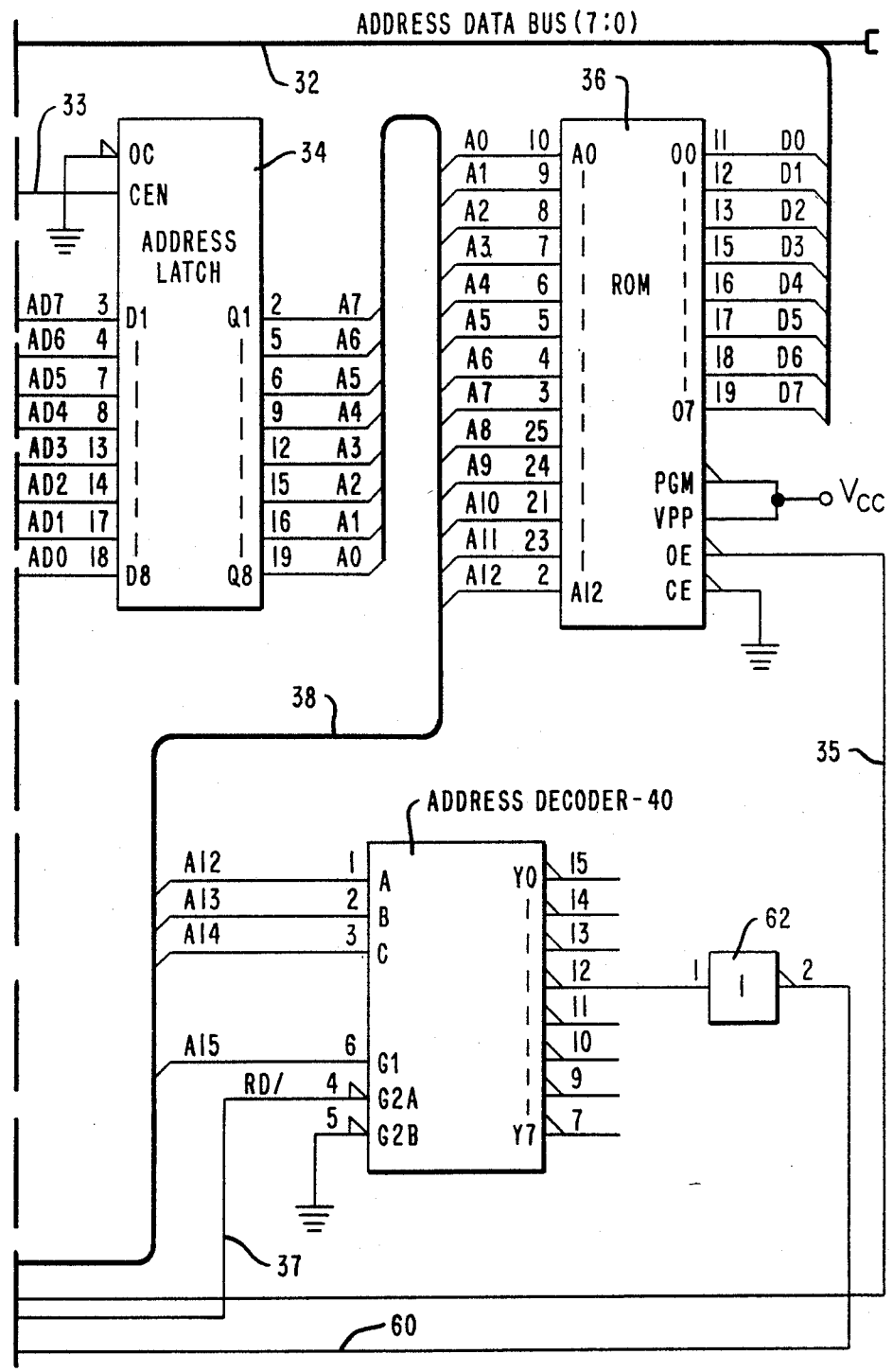

Shown in FIGS. 2A, 2B and 2C, when combined in the manner depicted in FIG. 2, is a circuit comprising those elements of the test device 10 which cooperate to provide the plurality of frequencies desired, and to further provide the capability for changing from one frequency to another. Included in these elements is a microprocessor 30, which may be of type 80C31, manufactured by Intel Corporation, Santa Clara, Calif. Positions P0.0–P0.7 inclusive of the microprocessor 30 are coupled by a data address bus 32 to positions D1–D8 inclusive of an address latch 34, which may be of type 74HC373, manufactured by Texas Instruments Incorporated, Dallas, Tex., and to positions 00–07 of a memory such as a read-only memory (ROM) 36 which may be of type I2764 manufactured by Intel Corporation. The address latch 34 is used to hold the least significant eight bits of the address for the ROM 36. These bits are stored in a first cycle of the microprocessor 30 and are combined in a subsequent cycle with the remaining necessary address bits, which are provided by positions P2.0–P2.4 of the microprocessor 30. Position ALE of the microprocessor 30 is connected by a conductor 33 to position CEN of the address latch 34. Position PSEN of the microprocessor 30 is connected by a conductor 35 to position OE of the ROM 36. Positions Q1–Q8 inclusive of the address latch 34 are coupled to address positions A0–A7 inclusive of the ROM 36 and positions P2.0–P2.4 of the microprocessor 30 are coupled to positions A8–A12 of the ROM 36 by means of an address bus 38. Positions 00–07 of the ROM 36 are coupled via the data address bus 32 to positions P0.0–P0.7 of the microprocessor 30.

Positions P2.4–P2.7 of the microprocessor 30 are coupled by the address bus 38 to positions A, B, C and G1 of an address decoder 40, which may be of type 74LS138, manufactured by Texas Instruments Incorporated. Position P3.7 of the microprocessor 30 is connected by a conductor 37 to position G2A of the address decoder 40.

The two basic frequencies to be provided by the test device 10 are generated, in the illustrated embodiment, by two crystal oscillators X1 and X2 (FIG. 2A). In the illustrated embodiment, oscillator X1 provides a frequency of 14.7456 MHZ and oscillator X2 provides a frequency of 12.000 MHZ. Of course, if desired, different types of frequency generators could be employed and different frequencies could be provided.

Each of the crystal oscillators X1 and X2 is connected at one side to a source of potential designated $V_{CC}$ and to ground through pin 7. The other side of the oscillator X1 is connected to one input of a NOR gate 48, which may be of type 74HC02, manufactured by Texas Instruments Incorporated. Similarly, the other side of the oscillator X2 is also connected to one input of a NOR gate 46, which may also be of type 74HC02. The outputs of the NOR gates 46 and 48 are connected to the inputs of a two-input NOR gate 50, which may also be of type 74HC02. The output of the NOR gate 50 is connected to the XTAL1 position of the microprocessor 30.

The other inputs of the NOR gates 46 and 48 are connected, respectively, to the Q and Q/ outputs of a flip-flop 52, which may be of type 74HC74, manufactured by Texas Instruments Incorporated. The PRE and CLR inputs of the flip-flop 52 are connected through nodes 54 and 56 to the potential source $V_{CC}$. The clock input of said flip-flop is connected through a node 57, a 4,700-ohm resistor 58 and the node 54 to the source $V_{CC}$, and is also connected through the node 57 and a conductor 60 to a node 82, which in turn is connected to one input of a NOR gate 80, which may be of type 74HC02. The node 82 is also connected by the conductor 60 to the output of an inverter 62 (FIG. 2C), which may be of type 7406, manufactured by Texas Instruments Incorporated, having its input connected in turn to position Y3 of the address decoder 40. The D input of the flip-flop 52 is connected by a conductor 53 to an output position P1.0 of the microprocessor 30.

A second input of the NOR gate 80 is connected via a conductor 66 to a node 68. A 10-microfarad capacitor 70 is connected between the node 68 and the node 56, to which is connected the potential source $V_{CC}$. A further branch from the node 68 extends through an 8,200-ohm resistor 72 and a node 74 to a ground connection. A diode 76 connects the node 74 to a node 78 on the conductor 66.

The node 78 is connected to one input of a NOR gate 80, which may be of type 74HC02. The other input of the NOR gate 80 is connected by a node 82 on the conductor 60 to the output of the inverter 62 (FIG. 2C). The output of the NOR gate 80 is connected to the TR input of a timer 84, which may be of type LM555, manufactured by Texas Instruments Incorporated, and which is configured as a monostable multivibrator. The CV input of the timer 84 is connected through a 0.01-microfarad capacitor 86 to ground. The R input of the timer 84 is connected through a node 88 to the potential source $V_{CC}$. A path extends from the node 88 through a one-megohm resistor 90, two nodes 92 and 94, and a 0.047-microfarad capacitor 96 to ground. The nodes 92 and 94 are connected, respectively, to the DIS and THR positions of the timer 84. The Q output of the timer 84 is connected by a conductor 98 to the reset position RST of the microprocessor 30.

Certain other connections between elements of the circuit of FIGS. 2A, 2B and 2C are clearly shown in the circuit diagram, and a written description thereof is not believed to be necessary for a clear understanding of the circuit.

The operation of the circuit of FIGS. 2A–2C inclusive is as follows. Upon initial power-up of the circuit, the outputs of the flip-flop 52 are in a random order. If the Q output of the flip-flop 52 and the input of corresponding NOR gate 46 are in a high state (+5 volts), the oscillator X2 is disabled because the output of NOR gate 46 assumes a low level (0 volts). The Q/ output of the flip-flop 52 and the corresponding input of NOR gate 48 will then have a low level. Because of the low level on said input of NOR gate 48, the oscillator X1 is enabled and the signal from said oscillator is passed through the NOR gate 50 and is applied to the XTAL1 input of the microprocessor 30. If the output levels of the flip-flop 52 were reversed at the time of power-up of the circuit, then the oscillator X2 would be enabled and the oscillator X1 would be disabled.

On the same power-up sequence, a high level is present at the input of NOR gate 80 which is connected to node 78 because of the RC time constant of the resistor 72 and the capacitor 70. As time passes (approximately 100 milliseconds with the values shown), the voltage level at said input of the NOR gate 80 will fall to zero volts. However, at the time that said input of the gate 80 is at a high level, the output of the gate 80 is at a low level. This low level signal is applied to the TR position of the timer 84, and causes the Q output of said timer to go to a high level for the time specified by the RC time constant of resistor 90 and capacitor 96 (approximately 50 milliseconds for the values shown), and then to return to a low level. This high-level pulse is applied over conductor 98 to the RST position of the microprocessor 30 and causes said microprocessor to be reset.

Also, at the time of power-up, there is a high level on the Y3 position (pin 12) of the address decoder 40. This signal is inverted by the inverter 62 and is applied over conductor 60, through node 82 to one input of the NOR gate 80, and through the node 57 to the CLK input of the flip-flop 52, causing these inputs to be held at a low level.

Upon initial power-up of the microprocessor 30, the random access memory contained therein has random data written throughout it. When the power-up reset pulse on the RST position of the microprocessor 30 is complete, the firmware program contained in the ROM 36 causes the system to perform a routine that first checks the contents of the random access memory (RAM) of the microprocessor 30 against specific byte patterns representing the available frequencies as generated by the oscillators X1 and X2.

Figure 3:
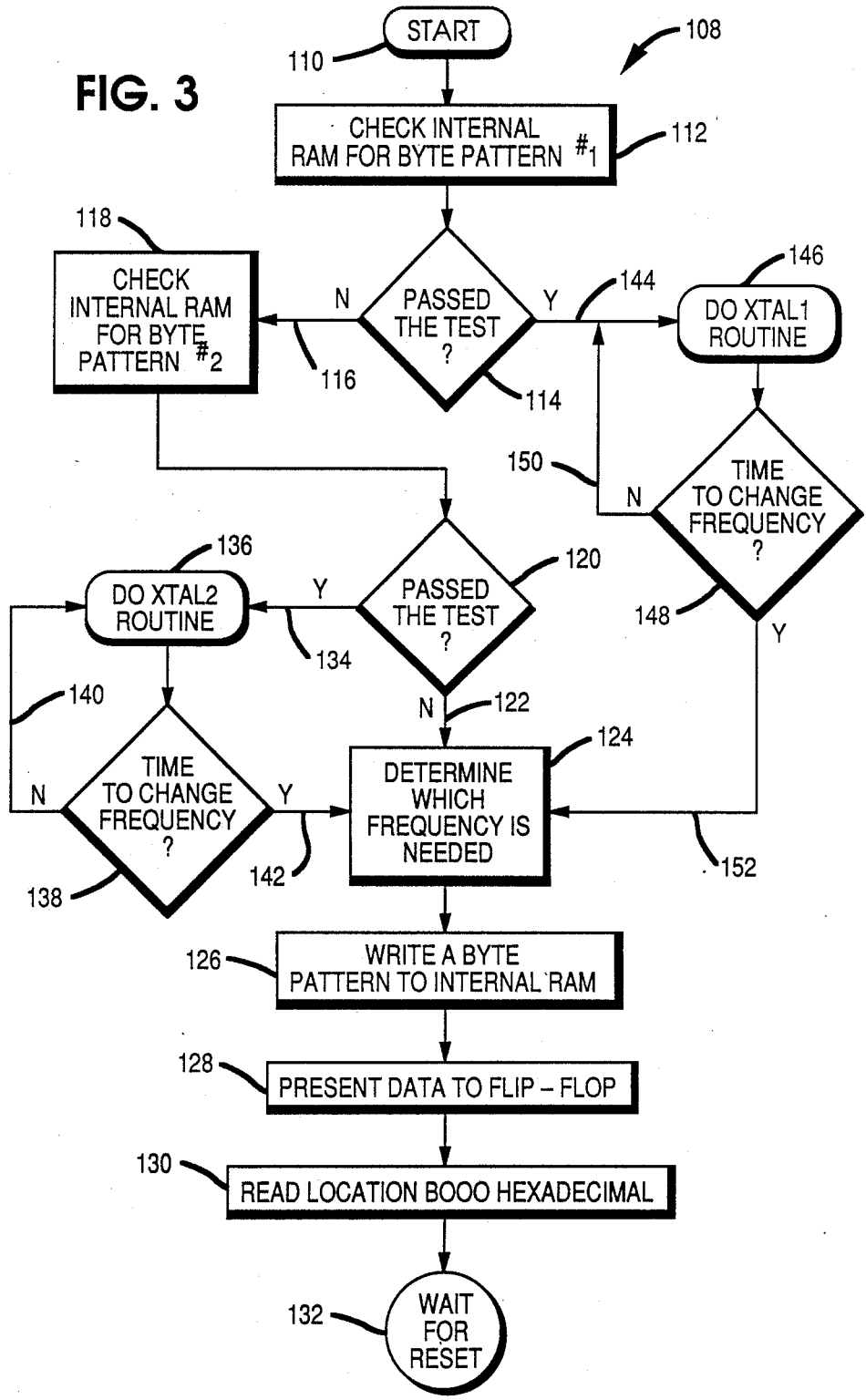
FIG. 3 is a flow diagram showing process by which frequencies are selected and changed in the present invention.

This routine or program 108 is shown in FIG. 3, and commences from a start condition, represented by block 110. First, as represented in block 112, the internal RAM of microprocessor 30 is checked to see if its contents match byte pattern no. 1 stored in ROM 36, corresponding to oscillator X1, and a determination is made (decision block 114) as to whether such a match exists. Since the data stored in the RAM at this point is random, because this is the initial power-up of the unit, and not a self-induced reset, the test will not be passed, and the process continues over path 116 to block 118, in which the internal RAM is checked to see if its contents match byte pattern no. 2 stored in ROM 36, corresponding to oscillator X2, and a determination is made (decision block 120) as to whether such a match exists. Again, since the data stored in the RAM at this point is random, the test will not be passed, and the process will continue over path 122 to a block 124, in which a determination is made as to which of the two frequencies generated by oscillators X1 and X2 is needed in the testing operation being performed.

The determination as to desired frequency referred to in block 124 may be made in any one of several ways. For example, this could be accomplished by elements of the system in accordance with an overall testing program, or could be accomplished by a human operator in response to a "display prompt" appearing on the screen of the test device 10. Such a "display prompt" could take the form of a message on the screen instructing the operator to the effect that if the terminal being tested is "brand A", to depress the "zero" key on the keyboard 18, and if the terminal being tested is "brand B", to depress the "one" key on the keyboard 18. The appropriate frequency for the indicated brand of terminal would then be selected.

Let it be assumed that a frequency of 12.000 MHZ is desired, and that the oscillator X2 is therefore selected for coupling to the microprocessor 30.

The first step in causing the microprocessor 30 to be provided with the desired frequency is to cause the appropriate byte pattern (in this case, byte pattern no. 2) to be written from the ROM 36 to the internal RAM, as indicated in block 126. The microprocessor 30 is then caused to provide a low level signal from position P1.0 via the conductor 53 to the D position of the flip-flop 52, as represented by block 128. Following this, the microprocessor 30 fetches the next instruction from the ROM 36, which tells the microprocessor to do an external read operation at location B000, as represented in block 130. This means that positions P2.4–P2.7 of the microprocessor are set. These signals are carried over address bus 38 to positions A, B, C and G1 in the address decoder 40. The microprocessor 30 then causes a low-level pulse of approximately 400–500 nanoseconds to appear at position P3.7. This pulse is carried over conductor 37 to position G2A of the address decoder 40, which in turn causes a low-level pulse of approximately 400–500 nanoseconds duration to occur at position 12 of the address decoder 40 and at the input of the inverter 62. This pulse is inverted by the inverter 62 and is carried over the conductor 60 and the node 82 to an input of the gate 80 and over the node 57 to the CLK input of the flip-flop 52. On the rising edge of this pulse, applied to the CLK input, the flip-flop 52 provides a low level Q output and a high-level Q/ output. These signal levels, applied to inputs of the NOR gates 46 and 48, respectively, cause the signal generated by the oscillator X2 to be applied to the input XTAL1 of the microprocessor 30 through the gates 46 and 50, and prevent the signal generated by the oscillator X1 from being applied to the microprocessor 30.

The process continues to block 132 where an instruction in the ROM 36 causes the microprocessor 30 to remain in an infinite loop routine, to await a reset operation. The high level on the input of the NOR gate 80 causes a low level signal to be applied to the TR position of the timer 84, which in turn causes another reset pulse to be transmitted via the conductor 98 to the RST position of the microprocessor 30, so that the microprocessor then goes through another reset sequence.

The program 108 then returns to the start block 110, where a check is again made of the internal RAM for byte pattern no. 1 (block 112). Since the internal RAM now contains byte pattern no. 2, this test is not passed (block 114) and the program continues to block 118, where the internal RAM contents are compared with byte pattern no. 2. This time, the test is passed (block 120), and the program continues over path 134 to block 136, in which the program routine associated with the selected frequency is performed. At the completion of performance of that routine, an inquiry is made (block 138) as to whether the frequency should be changed. This can be determined by the human operator or by a controlling program. If the frequency is not to be changed, the program returns over path 140 and the routine is repeated. If the frequency is to be changed, the program continues over path 142 to the previously-discussed block 124.

Let it now be assumed that the human operator wishes to select the frequency generated by oscillator X1. In such case, the corresponding byte pattern is written in the internal RAM (block 126) and the program continues through blocks 128, 130 and 132, as previously described.

When the program starts once again (block 110), the internal RAM is checked for byte pattern no. 1 (block 112) and this time the test is passed (block 114). The program then continues over path 144 to block 146, in which the program routine associated with the selected frequency is performed. At the completion of performance of that routine, an inquiry is made (block 148) as to whether the frequency should be changed. If the frequency is not to be changed, the program returns over path 150 and the routine is repeated. If the frequency is to be changed, the program continues over the path 152 to the previously-discussed block 124, and thence to the end of the program, in the manner previously described.

Although high-speed CMOS parts have been used in the circuit of FIGS. 2A-2C, other types of circuitry, such as TTL circuitry, could be used with the same results. In such case, a microprocessor of type 8031, manufactured by Intel Corporation, could be used. The output of the NOR gate 50 would be connected to the XTAL2 position of the microprocessor of type 8031, and the XTAL1 position of said microprocessor would be connected to ground. Also, oscillators with frequencies other than the values given above can be used so long as the frequency does not exceed the maximum frequency specification of the microprocessor 30 or the gates 46, 48 and 50.

While the form of the invention shown and described herein is admirably adapted to fulfill the objects primarily stated, it is to be understood that it is not intended to confine the invention to the form or embodiment disclosed herein, for it is susceptible of embodiment in various other forms within the scope of the appended claims.

What is claimed is:

1. Frequency control apparatus for providing a selected one of two frequencies to a microprocessor comprising, in combination:
    first frequency generating means capable of generating a signal having a first frequency;
    second frequency generating means capable of generating a signal having a second frequency;
    a microprocessor to which signals of said first frequency or said second frequency are selectively applied;
    logic circuit means for selectively gating a signal from either said first frequency generating means or said second frequency generating means to said microprocessor;
    flip-flop means for controlling said logic circuit means and having a first input coupled to an output of said microprocessor;
    address decoder means controlled by said microprocessor and coupled to a second input of said flip-flop means;
    memory means coupled to said microprocessor to provide data to said microprocessor for control thereof; and
    reset means controlled by said address decoder means and coupled to said microprocessor for resetting said microprocessor.

2. The frequency control apparatus of claim 1 in which said logic circuit means comprises: a first NOR gate having one input coupled to said first frequency generating means and a second input coupled to a first output of said flip-flop means; a second NOR gate having one input coupled to said second frequency generating means and a second input coupled to a second output of said flip-flop means; and a third NOR gate having first and second inputs coupled to the outputs of said first and second NOR gates and having an output coupled to said microprocessor.

3. The frequency control apparatus of claim 1 in which said first and second frequency generating means are crystal oscillators.

4. The frequency control apparatus of claim 1 in which said reset means comprises a coupled NOR gate and a monostable multivibrator.

5. The frequency control apparatus of claim 1 in which said memory means comprises a read-only memory.

6. The frequency control apparatus of claim 1, also including an address latch which is coupled to certain of the outputs of the microprocessor and to certain of the inputs of the memory means and which provides a portion of the address when the microprocessor addresses the memory.

7. The frequency control apparatus of claim 1, also including means for selecting one of the two frequencies.

8. The frequency control apparatus of claim 7, in which said means for selecting comprises a keyboard.

9. The frequency control apparatus of claim 1, in which byte patterns of data representing the first and second frequency generating means are stored in said memory means, and in which one of said byte patterns can be stored in a random access memory of said microprocessor to enable said microprocessor to select the corresponding frequency.

10. The frequency control apparatus of claim 9, in which frequency selection is accomplished by the microprocessor by comparing the byte pattern stored in the random access memory of the microprocessor with at least one of the byte patterns stored in the memory means.

11. The frequency control apparatus of claim 1, in which the microprocessor performs a comparison of data stored in a random access memory of said microprocessor with at least one byte pattern of data representing one of the two frequency generating means and stored in said memory means in order to determine whether a change of signal frequency is required.

12. A process for providing a selected one of two different frequencies from two frequency generating means through logic means to a microprocessor having memory means, comprising the following steps:
    (a) determining whether a data pattern in the microprocessor memory is identical to a first reference pattern associated with a first of two frequencies;
    (b) if said patterns are identical, controlling said logic means to cause a first of the two frequencies to be provided to the microprocessor from a first frequency generating means;
    (c) if said patterns are not identical, determining whether the data pattern in the microprocessor memory is identical to a second reference pattern associated with a second of the two frequencies;
    (d) if said data pattern and said second reference pattern are identical, controlling said logic means to cause a second of the two frequencies to be provided to the microprocessor from a second frequency generating means;
    (e) if said data pattern and said second reference pattern are not identical, determining which of the two frequencies is required;
    (f) writing a reference pattern associated with the selected one of the two frequencies into the microprocessor memory means;
    (g) resetting the microprocessor;
    (h) making a further determination as to whether the data pattern which has been written into the microprocessor memory is identical to said first reference pattern; and
    (i) repeating conditional steps b, c and d to cause the desired frequency to be provided to the microprocessor until the desired frequency is changed.

13. The process of claim 12, in which the first and second reference patterns are stored in a read-only memory.

14. The process of claim 12, in which the logic means is controlled in steps b and d by the microprocessor performing an external read operation which causes a signal to be sent to said logic means.

* * * * *

UNITED STATES PATENT AND TRADEMARK OFFICE
CERTIFICATE OF CORRECTION

PATENT NO. : 4,958,309

DATED : September 18, 1990

INVENTOR(S) : Randy J. Turkal

It is certified that error appears in the above-identified patent and that said Letters Patent is hereby corrected as shown below:

> Title page:
> [73] Assignee: delete "NRC Corporation" and substitute --NCR Corporation--.

Signed and Sealed this

Tenth Day of December, 1991

Attest:

HARRY F. MANBECK, JR.

*Attesting Officer*  *Commissioner of Patents and Trademarks*